United States Patent
Kawato et al.

(10) Patent No.: US 9,120,944 B2
(45) Date of Patent: Sep. 1, 2015

(54) COPPER PARTICULATE DISPERSION, CONDUCTIVE FILM FORMING METHOD AND CIRCUIT BOARD

(75) Inventors: Yuichi Kawato, Hyogo (JP); Yusuke Maeda, Hyogo (JP); Tomio Kudo, Hyogo (JP)

(73) Assignees: ISHIHARA CHEMICAL CO., LTD., Hyogo (JP); APPLIED NANOTECH HOLDINGS, INC., Austin, TX (US)

( * ) Notice: Subject to any disclaimer, the term of this patent is extended or adjusted under 35 U.S.C. 154(b) by 0 days.

(21) Appl. No.: 14/346,534

(22) PCT Filed: Jan. 4, 2012

(86) PCT No.: PCT/JP2012/050010
§ 371 (c)(1),
(2), (4) Date: Mar. 21, 2014

(87) PCT Pub. No.: WO2013/073200
PCT Pub. Date: May 23, 2013

(65) Prior Publication Data
US 2014/0216798 A1     Aug. 7, 2014

(30) Foreign Application Priority Data
Nov. 14, 2011   (JP) .................................. 2011-248127

(51) Int. Cl.
| | | |
|---|---|---|
| C09D 11/52 | (2014.01) | |
| H05K 1/09 | (2006.01) | |
| H01B 1/02 | (2006.01) | |
| H01B 1/22 | (2006.01) | |
| H01L 23/498 | (2006.01) | |
| C09D 11/03 | (2014.01) | |
| C09D 11/38 | (2014.01) | |

(52) U.S. Cl.
CPC ................ *C09D 11/52* (2013.01); *C09D 11/03* (2013.01); *H01B 1/026* (2013.01); *H01B 1/22* (2013.01); *H01L 23/49883* (2013.01); *H05K 1/092* (2013.01); *H05K 1/095* (2013.01); *H05K 1/097* (2013.01); *C09D 11/38* (2013.01); *H05K 2203/0514* (2013.01)

(58) Field of Classification Search
CPC ....... C09D 11/52; H05K 1/092; H05K 1/095; H05K 1/097
See application file for complete search history.

(56) References Cited

U.S. PATENT DOCUMENTS

| | | |
|---|---|---|
| 2004/0009294 A1 | 1/2004 | Hideto et al. |
| 2008/0286488 A1 | 11/2008 | Li et al. |
| 2009/0151998 A1 | 6/2009 | Fujiwara et al. |
| 2010/0000762 A1 | 1/2010 | Mohshi et al. |

FOREIGN PATENT DOCUMENTS

| | | |
|---|---|---|
| JP | 2004-043776 A | 2/2004 |
| JP | 2004-185952 A | 7/2004 |
| JP | 2008-88518 A | 4/2008 |
| JP | 2009-105040 A | 5/2009 |
| JP | 2009-135480 A | 6/2009 |
| WO | 2008/051719 A1 | 5/2008 |
| WO | 2009/111393 A2 | 9/2009 |
| WO | 2010/114769 A1 | 10/2010 |
| WO | 2011/031118 A2 | 3/2011 |

OTHER PUBLICATIONS

U.S. Appl. No. 14/346,519, which was filed Mar. 21, 2014.
U.S. Appl. No. 14/346,544, which was filed Mar. 21, 2014.
Extended European search report for EP Application No. 12849820.1, mail date is Mar. 11, 2015.
Korean Office Action issued for application No.10-2014-7009076, mail date is May 18, 2015.
Search Report issued with respect to International Application No. PCT/JP2012/050010, mail date is Apr. 3, 2012.
U.S. Appl. No. 14/346,519, which was filed on Mar. 21, 2014.
U.S. Appl. No. 14/346,544, which was filed on Mar. 21, 2014.

*Primary Examiner* — Jeremy C Norris
(74) *Attorney, Agent, or Firm* — Greenblum & Bernstein, P.L.C.

(57) ABSTRACT

An object is to provide a copper particulate dispersion which is suited to discharge in the form of droplets.
The copper particulate dispersion includes copper particulates, at least one kind of a dispersion vehicle containing the copper particulates, and at least one kind of dispersant which allows the copper particulates to disperse in the dispersion vehicle. The copper particulates have a center particle diameter of 1 nm or more and less than 100 nm. The dispersion vehicle is a polar dispersion vehicle having a boiling point within a range from 150° C. to 250° C. Whereby, when the copper particulate dispersion is discharged in the form of droplets, clogging at the discharge portion caused by drying of the dispersion vehicle is prevented and the viscosity is low for its high boiling point, and thus the copper particulate dispersion is suited to discharge in the form of droplets.

3 Claims, No Drawings

COPPER PARTICULATE DISPERSION, CONDUCTIVE FILM FORMING METHOD AND CIRCUIT BOARD

TECHNICAL FIELD

The present invention relates to a copper particulate dispersion, a conductive film forming method using the copper particulate dispersion, and a circuit board produced by using the conductive film forming method.

BACKGROUND ART

There has hitherto existed a printed board in which a circuit composed of a copper foil is formed on a substrate by photolithography. Photolithography includes the step of etching a copper foil and high costs are required for a treatment of waste fluid generated by etching.

There has been known, as the technology requiring no etching, a method in which a copper particulate dispersion prepared by dispersing copper particulates (copper nanoparticles) in a dispersion vehicle (in a vehicle) is discharged from an ink-jet printer on a substrate in the form of droplets to form a circuit (see, for example, Patent Literature 1). According to this method, a film of the copper particulate dispersion is formed on the substrate by discharging droplets and, after drying the film, copper particulates in the film are melted by exposure to light and thus conductivity is imparted to the film. It is considered that the viscosity of the copper particulate dispersion is desirably less than 20 mPa·s so as to enable the dispersion to discharge in the form of droplets. The film of the copper particulate dispersion is dried by heating to room temperature or a temperature of 150° C. or lower so that a substrate is not damaged by heat even if the substrate is made of a resin. For the purpose of making an attempt to reduce the amount of the dispersion vehicle which remains after drying, a dispersion vehicle having a boiling point of lower than 150° C. is selected.

However, because of low boiling point of the dispersion vehicle, such a copper particulate dispersion is likely to be excessively dried to cause clogging with copper particulates at the portion from which the dispersion is discharged in the form of droplets. In contrast, high boiling point of the dispersion vehicle may sometimes cause an increase in viscosity, and thus it may become difficult to discharge the copper particulate dispersion in the form of droplets.

CITATION LIST

Patent Literature

Patent Literature 1: U.S. Patent Application No. 2008/0286488

SUMMARY OF INVENTION

Technical Problem

The present invention is made so as to solve the above-mentioned problems and an object thereof is to provide a copper particulate dispersion which is suited to discharge in the form of droplets.

Solution to Problem

The copper particulate dispersion of the present invention includes copper particulates, at least one kind of a dispersion vehicle containing the copper particulates, and at least one kind of dispersant which allows the copper particulates to disperse in the dispersion vehicle, wherein the copper particulates have a center particle diameter of 1 nm or more and less than 100 nm, and the dispersion vehicle is a polar dispersion vehicle having a boiling point within a range from 150° C. to 250° C.

In this copper particulate dispersion, the dispersant is preferably a compound having at least one acidic functional group, which has a molecular weight of 200 or more and 100,000 or less, or a salt thereof.

In this copper particulate dispersion, the polar dispersion vehicle preferably contains at least one of a protic dispersion vehicle and an aprotic polar dispersion vehicle having a dielectric constant of 30 or more.

In this copper particulate dispersion, the protic dispersion vehicle is preferably a linear or branched alkyl compound or alkenyl compound of 5 or more and 30 or less carbon atoms, which has one hydroxyl group.

In this copper particulate dispersion, the protic dispersion vehicle may be a linear or branched alkyl compound or alkenyl compound of 2 or more and 30 or less carbon atoms, which has 2 or more and 6 or less hydroxyl groups.

In this copper particulate dispersion, the protic dispersion vehicle may have 1 or more and 10 or less ether bonds.

In this copper particulate dispersion, the protic dispersion vehicle may have 1 or more and 5 or less carbonyl groups.

In this copper particulate dispersion, the aprotic polar dispersion vehicle is preferably selected from the group consisting of N,N-dimethylacetamide, N,N-dimethylformamide, N-methyl pyrrolidone, γ-butyrolactone, 1,3-dimethyl-2-imidazolidinone and propylene carbonate.

In this copper particulate dispersion, the acidic functional group of the dispersant is preferably selected from the group consisting of a phosphoric acid group, a phosphonic acid group, a sulfonic acid group, a sulfuric acid group and a carboxyl group.

The conductive film forming method of the present invention includes the steps of discharging the copper particulate dispersion on a surface of an object in the form of droplets to form a film made of the copper particulate dispersion on the surface of the object, drying the film thus formed, and forming a conductive film through photo sintering of irradiating the dried film with light.

The circuit board of the present invention includes a circuit including the conductive film formed by the conductive film forming method on a substrate.

Advantageous Effects of Invention

According to the copper particulate dispersion of the present invention, since copper particulates have a small particle size and contain a dispersant, a surface of the copper particulates is coated with the dispersion vehicle molecules and the coated copper particulates are dispersed in a dispersion vehicle. Since a boiling point of the dispersion vehicle was adjusted to 150° C. or higher, in case of discharging the copper particulate dispersion in the form of droplets, it is possible to prevent clogging of the discharge portion caused by drying of the dispersion vehicle. Since a boiling point of the dispersion vehicle was adjusted to 250° C. or lower, it is possible to easily dry a film formed by discharging the copper particulate dispersion. Since polar dispersion vehicle was used as the dispersion vehicle, the viscosity is low for its high boiling point, and thus the copper particulate dispersion is suited to discharge in the form of droplets.

DESCRIPTION OF EMBODIMENTS

The copper particulate dispersion according to the embodiment of the present invention will be described. The copper particulate dispersion includes copper particulates, at least one kind of a dispersion vehicle containing the copper particulates, and at least one kind of a dispersant. The dispersant allows the copper particulates to disperse in a dispersion vehicle. In the present embodiment, the copper particulates are particles of copper, which have a center particle diameter of 1 nm or more and less than 100 nm. A polar dispersion vehicle having a boiling point within a range from 150° C. to 250° C. is used as the dispersion vehicle. The polar dispersion vehicle is protic, or when it is aprotic, a dielectric constant is 30 or more. The dispersant is a compound having a molecular weight of 200 or more and 100,000 or less, or a salt thereof, and it has at least one acidic functional group.

The copper particulates are particles of copper, which have a center particle diameter of 1 nm or more and less than 100 nm, and copper particulates having the same center particle diameter may be used alone, or copper particulates having two or more kinds of center particle diameters may be used in combination. When the center particle diameter is 100 nm or more, the weight of particles increases, resulting in poor dispersion stability.

The concentration of copper particulates is 1% by weight or more and 80% by weight or less based on the copper particulate dispersion. When the concentration of copper particulates is less than 1% by weight, it is impossible to obtain copper particulates in the amount enough to form a conductive film. In contrast, when the concentration is more than 80% by weight, dispersion stability is poor due to too large amount of copper particulates.

This protic dispersion vehicle is a linear or branched alkyl compound or alkenyl compound of 5 or more and 30 or less carbon atoms, which has one hydroxyl group. This protic dispersion vehicle may have 1 or more and 10 or less ether bonds, and may have 1 or more and 5 or less carbonyl groups. In case of having 4 or less carbon atoms, polarity of the dispersion vehicle increases and thus the dispersion effect of copper particulates is obtained. However, elution (corrosion) of copper particulates into the dispersion vehicle occurs, resulting in poor dispersion stability. In case of having more than 30 carbon atoms, polarity of the dispersion vehicle decreases and thus it becomes impossible to dissolve a dispersant.

Examples of such a protic dispersion vehicle include, but are not limited to, 3-methoxy-3-methyl butanol, triethylene glycol monomethyl ether, diethylene glycol monobutyl ether, diethylene glycol monomethyl ether, propylene glycol monobutyl ether, ethylene glycol monohexyl ether, ethylene glycol mono-tert-butyl ether, 2-octanol and the like.

The protic dispersion vehicle may be a linear or branched alkyl compound or alkenyl compound of 2 or more and 30 or less carbon atoms, which has 2 or more and 6 or less hydroxyl groups. This protic dispersion vehicle may have 1 or more and 10 or less ether bonds, and may have 1 or more and 5 or less carbonyl groups.

Examples of such a protic dispersion vehicle include, but are not limited to, 2-methylpentane-2,4-diol, ethylene glycol, propylene glycol, 1,5-pentanediol, diethylene glycol, triethylene glycol, glycerin, sorbitol and the like.

Examples of the aprotic polar dispersion vehicle having a dielectric constant of 30 or more include, but are not limited to, propylene carbonate, 1,3-dimethyl-2-imidaolidinone, hexamethylphosphoramide, N-methyl pyrrolidone, N-ethyl pyrrolidone, nitrobenzene, N,N-diethylformamide, N,N-dimethylacetamide, furfural, γ-butyrolactone, ethylene sulfite, sulfolane, dimethyl sulfoxide, succinonitrile, ethylene carbonate and the like.

These polar dispersion vehicle may be used alone, or two or more kinds of them may be appropriately used in combination.

This dispersant is a compound having at least one or more acidic functional group, which has a molecular weight of 200 or more and 100,000 or less, or a salt thereof. The acidic functional group of the dispersant is a functional group having acidity, namely, proton donor ability and includes, for example, a phosphoric acid group, a phosphonic acid group, a sulfonic acid group, a sulfuric acid group and a carboxyl group.

In case of using these dispersants, they may be used alone, or two or more kinds of them may be appropriately used in combination. The concentration of the dispersant is 0.5% by weight or more and 50% by weight or less based on the copper particulate dispersion. When the concentration of the dispersant is less than 0.5% by weight, sufficient dispersion effect cannot be obtained. In contrast, when the concentration is more than 50% by weight, in case of using the copper particulate dispersion in a printing method, it exerts an adverse influence on printing characteristics.

It is possible to appropriately add a viscosity modifier, a leveling agent, a surface modifier, a defoamer, a corrosion prevention agent, a resin component, a photo sintering modifier and the like to these copper particulate dispersions according to intended uses as long as dispersion stability is not impaired.

According to the copper particulate dispersion mixed as mentioned above, since copper particulates have a small particle size and contain a dispersant, a surface of the copper particulates is coated with the dispersion vehicle molecules and the coated copper particulates are dispersed in a dispersion vehicle. Since a boiling point of the dispersion vehicle was adjusted to 150° C. or higher, in case of discharging the copper particulate dispersion from an ink-jet printer or the like in the form of droplets, it is possible to prevent clogging of the discharge portion caused by drying of the dispersion vehicle. Since a boiling point of the dispersion vehicle was adjusted to 250° C. or lower, it is possible to easily dry a film formed by discharging the copper particulate dispersion. Since polar dispersion vehicle was used as the dispersion vehicle, the viscosity is low for its high boiling point, and thus the copper particulate dispersion is suited to discharge in the form of droplets.

Since a dispersant has an acidic functional group and a dispersion vehicle is a polar dispersion vehicle, the dispersant has compatibility with the dispersion vehicle. Therefore, the copper particulates having a surface coated with dispersant molecules are dispersed in a dispersion vehicle.

When the dispersion vehicle is a protic dispersion vehicle, a boiling point is increased by a hydrogen bond between dispersion vehicle molecules and the viscosity is low for its high boiling point, and thus the copper particulate dispersion is suited to discharge in the form of droplets.

Since polarity increases when the protic dispersion vehicle has an ether bond or a carbonyl group, the boiling point increases and the viscosity is low for its high boiling point, and thus the copper particulate dispersion is suited to discharge in the form of droplets.

Since the dielectric constant is high when the dispersion vehicle is an aprotic polar dispersion vehicle having a dielectric constant of 30 or more, the boiling point is increased by an electrostatic interaction and the viscosity is low for its high boiling point, and thus the copper particulate dispersion is suited to discharge in the form of droplets.

The inventors of the present invention have found the formulation of the copper particulate dispersion by carrying out numerous experiments.

The conductive film forming method using a copper particulate dispersion of the present embodiment will be described. First, a copper particulate dispersion is discharged on a surface of an object in the form of droplets to form a film made of the copper particulate dispersion on the surface of the object. The object is, for example, a substrate made of polyimide or glass. The copper particulate dispersion is discharged in the form of droplets by, for example, an ink-jet printer. The copper particulate dispersion is used as an ink for ink-jet printer, and a predetermined pattern is printed on the object by an ink-jet printer to form a film with the pattern.

Next, the film made of the copper particulate dispersion is dried. The dispersion vehicle and the dispersant in the copper particulate dispersion are vaporized by drying the film, and thus copper particulates remain. The drying time of the film varies depending on the dispersion vehicle, and drying is completed within 30 minutes under an air atmosphere at 100° C. In order to shorten the drying time of the film, the film may be subjected to air flow.

Next, the dried film is irradiated with light. Copper particulates are fired by irradiation with light. In firing (photo sintering) by irradiation with light, reduction of a surface oxide film of copper particulates and sintering of copper particulates occur. The copper particulates are mutually melted in sintering and welded to the substrate. Photo sintering is performed at room temperature under atmospheric air. A light source used in photo sintering is, for example, a xenon lamp. A laser equipment may be used as a light source. Magnitude of energy of light irradiated from the light source is within a range of 0.1 J/cm$^2$ or more and 100 J/cm$^2$ or less. The irradiation time is 0.1 ms or more and 100 ms or less. Irradiation may be performed once or plural times (multistage irradiation). Conductivity is imparted to the film subjected to photo sintering. Whereby, a conductive film is formed. The thus formed conductive film is in the form of a continuous film. Resistivity of the conductive film is from 2 μΩ·cm to 9 μΩ·cm.

The circuit board produced by using this conductive film forming method will be described. This circuit board includes a circuit on a substrate. The substrate is obtained by forming an insulating material such as polyimide or glass into a plate and is, for example, a flexible substrate or a rigid substrate. The substrate may be composed of a semiconductor such as a silicone wafer. The circuit includes a conductive film formed by this conductive film forming method. The conductive film constitutes, for example, a conducting wire which electrically connects between circuit elements. The conductive film may constitute the circuit element or a part thereof, for example, a coil, an electrode of a capacitor and the like.

A copper particulate dispersion as Example of the present invention, and a copper particulate dispersion for comparison were prepared. The copper particulate dispersion was prepared by the following method, and then evaluated. After weighing a predetermined concentration, copper particulates were gradually added to a dispersant and dispersion vehicle compatibilized mutually, followed by mixing and stabilization at a given temperature for a given time using a disperser. Dispersibility of the thus prepared copper particulate dispersion was confirmed by the fact that no precipitate is formed, and coarse particles are absent on a film after printing. Dispersion stability was confirmed by the fact that no precipitate is formed after storage of the copper particulate dispersion at 5° C. for one month. Viscosity of the copper particulate dispersion was measured at 20° C. using a viscometer.

The conductive film formed from the copper particulate dispersion was evaluated by the following method. The copper particulate dispersion was printed on a polyimide substrate in a film thickness of about 0.5 μm by an industrial ink-jet printer, dried under an atmospheric air atmosphere at 100° C. for 30 minutes, and then subjected to photo sintering by a flash irradiation device using a xenon lamp. Photo sintering was carried out at magnitude of energy within a range from 0.5 to 30 J/cm$^2$ for 0.1 ms to 10 ms until a conductive film having optimum resistivity was obtained by irradiation with light once or plural times.

EXAMPLE 1

Using copper particulates having a center particle diameter of 20 nm, 3-methoxy-3-methyl butanol (with proticity, boiling point: 174° C.) as a dispersion vehicle, and a compound having a phosphoric acid group which has a molecular weight of about 1,500 (manufactured by BYK-Chemie under the trade name of "DISPERBYK (registered trademark)-111") as a dispersant, a copper particulate dispersion was prepared. The concentration of the dispersant was adjusted to 1.8% by weight and the concentration of copper particulates was adjusted to 22.5% by weight. The concentration of the dispersion vehicle is balance thereof. This copper particulate dispersion had a viscosity of 18 mPa·s, which is less than 20 mPa·s, desired for an ink for ink-jet printer. A conductive film formed by photo sintering using this copper particulate dispersion had a resistivity of 9 μΩ·cm, and a desired value was obtained. This copper particulate dispersion was stored at 5° C. for one month. As a result, no change occurred and thus it was confirmed to have high dispersion stability.

EXAMPLE 2

In the same manner as in Example 1, except that the center particle diameter of copper particulates was changed to 40 nm, a copper particulate dispersion was prepared. This copper particulate dispersion had a viscosity of 17 mPa·s. A conductive film formed by photo sintering using this copper particulate dispersion had a resistivity of 9 μΩ·cm, and a desired value was obtained. This copper particulate dispersion was stored at 5° C. for one month. As a result, no change occurred and thus it was confirmed to have high dispersion stability.

EXAMPLE 3

In the same manner as in Example 2, except that the center particle diameter of copper particulates was changed to 70 nm, a copper particulate dispersion was prepared. This copper particulate dispersion had a viscosity of 16 mPa·s. A conductive film formed by photo sintering using this copper particulate dispersion had a resistivity of 8 μΩ·cm, and a desired value was obtained. This copper particulate dispersion was stored at 5° C. for one month. As a result, no change occurred and thus it was confirmed to have high dispersion stability.

EXAMPLE 4

In the same manner as in Example 3, except that the concentration of the dispersant was changed to 1.8% by weight and the concentration of copper particulates was changed to 10% by weight, a copper particulate dispersion was prepared.

This copper particulate dispersion had a viscosity of 8 mPa·s. A conductive film formed by photo sintering using this copper particulate dispersion had a resistivity of 9 μΩ·cm. This copper particulate dispersion was stored at 5° C. for one month. As a result, no change occurred.

EXAMPLE 5

In the same manner as in Example 4, except that the dispersion vehicle was changed to diethylene glycol monobutyl ether (with proticity, boiling point: 230° C.) and the concentration of copper particulates was changed to 45% by weight, a copper particulate dispersion was prepared. This copper particulate dispersion had a viscosity of 8 mPa·s. A conductive film formed by photo sintering using this copper particulate dispersion had a resistivity of 8 μΩ·cm. This copper particulate dispersion was stored at 5° C. for one month. As a result, no change occurred.

EXAMPLE 6

In the same manner as in Example 5, except that the dispersant was changed to a compound having a phosphoric acid group, which has a molecular weight of several tens of thousands (manufactured by BYK-Chemie under the trade name of "DISPERBYK (registered trademark)-2001"), a copper particulate dispersion was prepared. This copper particulate dispersion had a viscosity of 11 mPa·s. A conductive film formed by photo sintering using this copper particulate dispersion had a resistivity of 5 μΩ·cm. This copper particulate dispersion was stored at 5° C. for one month. As a result, no change occurred.

EXAMPLE 7

In the same manner as in Example 5, except that the dispersion vehicle was changed to diethylene glycol monomethyl ether (with proticity, boiling point: 194° C.), a copper particulate dispersion was prepared. This copper particulate dispersion had a viscosity of 6 mPa·s. A conductive film formed by photo sintering using this copper particulate dispersion had a resistivity of 7 μΩ·cm. This copper particulate dispersion was stored at 5° C. for one month. As a result, no change occurred.

EXAMPLE 8

In the same manner as in Example 7, except that the dispersion vehicle was changed to a mixture of 3-methoxy-3-methyl butanol (with proticity, boiling point: 174° C.) with triethylene glycol monomethyl ether (protic polarity, boiling point: 249° C.) at a mixing ratio of 1:1, a copper particulate dispersion was prepared. This copper particulate dispersion had a viscosity of 15 mPa·s. A conductive film formed by photo sintering using this copper particulate dispersion had a resistivity of 5 μΩ·cm. This copper particulate dispersion was stored at 5° C. for one month. As a result, no change occurred.

EXAMPLE 9

In the same manner as in Example 8, except that the dispersion vehicle was changed to a mixture of diethylene glycol monomethyl ether (with proticity, boiling point: 194° C.) with triethylene glycol monomethyl ether (with proticity, boiling point: 249° C.) at a mixing ratio of 1:1, a copper particulate dispersion was prepared. This copper particulate dispersion had a viscosity of 7 mPa·s. A conductive film formed by photo sintering using this copper particulate dispersion had a resistivity of 7 μΩ·cm. This copper particulate dispersion was stored at 5° C. for one month. As a result, no change occurred.

EXAMPLE 10

In the same manner as in Example 9, except that the dispersion vehicle was changed to N,N-dimethylacetamide (with aprotic polarity, dielectric constant: 38, boiling point: 165° C.), a copper particulate dispersion was prepared. This copper particulate dispersion had a viscosity of 4 mPa·s. A conductive film formed by photo sintering using this copper particulate dispersion had a resistivity of 7 μΩ·cm. This copper particulate dispersion was stored at 5° C. for one month. As a result, no change occurred.

EXAMPLE 11

In the same manner as in Example 10, except that the dispersion vehicle was changed to N,N-dimethylformamide (with aprotic polarity, dielectric constant: 37, boiling point: 153° C.), a copper particulate dispersion was prepared. This copper particulate dispersion had a viscosity of 3 mPa·s. A conductive film formed by photo sintering using this copper particulate dispersion had a resistivity of 4 μΩ·cm. This copper particulate dispersion was stored at 5° C. for one month. As a result, no change occurred.

EXAMPLE 12

In the same manner as in Example 11, except that the dispersion vehicle was changed to N-methyl pyrrolidone (with aprotic polarity, dielectric constant: 32, boiling point: 204° C.), a copper particulate dispersion was prepared. This copper particulate dispersion had a viscosity of 5 mPa·s. A conductive film formed by photo sintering using this copper particulate dispersion had a resistivity of 5 μΩ·cm. This copper particulate dispersion was stored at 5° C. for one month. As a result, no change occurred.

EXAMPLE 13

In the same manner as in Example 11, except that the dispersion vehicle was changed to γ-butyrolactone (with aprotic polarity, dielectric constant: 39, boiling point: 204° C.), a copper particulate dispersion was prepared. This copper particulate dispersion had a viscosity of 9 mPa·s. A conductive film formed by photo sintering using this copper particulate dispersion had a resistivity of 6 μΩ·cm. This copper particulate dispersion was stored at 5° C. for one month. As a result, no change occurred.

EXAMPLE 14

In the same manner as in Example 6, except that the dispersion vehicle was changed to γ-butyrolactone (with aprotic polarity, dielectric constant: 39, boiling point: 204° C.) and the concentration of the dispersant was changed to 3.6% by weight, a copper particulate dispersion was prepared. This copper particulate dispersion had a viscosity of 6 mPa·s. A conductive film formed by photo sintering using this copper particulate dispersion had a resistivity of 7 μΩ·cm. This copper particulate dispersion was stored at 5° C. for one month. As a result, no change occurred.

EXAMPLE 15

In the same manner as in Example 13, except that the dispersion vehicle was changed to 1,3-dimethyl-2-imidazolidinone (with aprotic polarity, dielectric constant: 38, boiling point: 225° C.), a copper particulate dispersion was prepared. This copper particulate dispersion had a viscosity of 8 mPa·s. A conductive film formed by photo sintering using this copper particulate dispersion had a resistivity of 5 μΩ·cm. This copper particulate dispersion was stored at 5° C. for one month. As a result, no change occurred.

EXAMPLE 16

In the same manner as in Example 15, except that the dispersant was changed to a mixture of "DISPERBYK (registered trademark)-111" with "DISPERBYK (registered trademark)-2001" at a mixing ratio of 1:2 and the concentration thereof was changed to 3.6% by weight, a copper particulate dispersion was prepared. This copper particulate dispersion had a viscosity of 5 mPa·s. A conductive film formed by photo sintering using this copper particulate dispersion had a resistivity of 5 μΩ·cm. This copper particulate dispersion was stored at 5° C. for one month. As a result, no change occurred.

EXAMPLE 17

In the same manner as in Example 15, except that the dispersant was changed to a phosphate having a phosphoric acid group, which has a molecular weight of 1,000 or more and less than 10,000 (manufactured by BYK-Chemie under the trade name of "DISPERBYK (registered trademark)-145"), a copper particulate dispersion was prepared. This copper particulate dispersion had a viscosity of 10 mPa·s. A conductive film formed by photo sintering using this copper particulate dispersion had a resistivity of 4 μΩ·cm. This copper particulate dispersion was stored at 5° C. for one month. As a result, no change occurred.

EXAMPLE 18

In the same manner as in Example 17, except that the dispersant was changed to a low molecular polyaminoamide and an acid polymer salt (manufactured by BYK-Chemie under the trade name of "ANTI-TERRA (registered trademark)-U100"), a copper particulate dispersion was prepared. This copper particulate dispersion had a viscosity of 14 mPa·s. A conductive film formed by photo sintering using this copper particulate dispersion had a resistivity of 2 μΩ·cm. This copper particulate dispersion was stored at 5° C. for one month. As a result, no change occurred.

EXAMPLE 19

In the same manner as in Example 14, except that the dispersion vehicle was changed to propylene carbonate (with aprotic polarity, dielectric constant: 64, boiling point: 240° C.) and the concentration of the dispersant was changed to 1.8% by weight, a copper particulate dispersion was prepared. This copper particulate dispersion had a viscosity of 10 mPa·s. A conductive film formed by photo sintering using this copper particulate dispersion had a resistivity of 7 μΩ·cm. This copper particulate dispersion was stored at 5° C. for one month. As a result, no change occurred.

EXAMPLE 20

In the same manner as in Example 18, except that the dispersant was changed to an alkylammonium salt of a compound having a phosphoric acid group, which has a molecular weight of 1,000 or more and 2,000 or less (manufactured by BYK-Chemie under the trade name of "DISPERBYK (registered trademark)-180"), a copper particulate dispersion was prepared. This copper particulate dispersion had a viscosity of 9 mPa·s. A conductive film formed by photo sintering using this copper particulate dispersion had a resistivity of 4 μΩ·cm. This copper particulate dispersion was stored at 5° C. for one month. As a result, no change occurred.

COMPARATIVE EXAMPLE 1

In the same manner as in Example 15, except that the dispersion vehicle was changed to propylene glycol methyl ether acetate (with nonpolarity), a copper particulate dispersion was prepared. This copper particulate dispersion had a viscosity of 5 mPa·s. This copper particulate dispersion was stored at 5° C. for one month. As a result, a precipitate was formed and thus it was found to have non-high dispersion stability.

COMPARATIVE EXAMPLE 2

In the same manner as in Comparative Example 1, except that the dispersion vehicle was changed to a mixture of butoxyethyl acetate and propylene glycol methyl ether acetate at a mixing ratio of 5:1 (with nonpolarity), a copper particulate dispersion was prepared. This copper particulate dispersion had a viscosity of 5 mPa·s. This copper particulate dispersion was stored at 5° C. for one month. As a result, a precipitate was formed.

COMPARATIVE EXAMPLE 3

In the same manner as in Comparative Example 2, except that the dispersion vehicle was changed to diethylene glycol methyl ethyl ether (with nonpolarity), a copper particulate dispersion was prepared. This copper particulate dispersion had a viscosity of 2 mPa·s. This copper particulate dispersion was stored at 5° C. for one month. As a result, a precipitate was formed.

COMPARATIVE EXAMPLE 4

In the same manner as in Comparative Example 3, except that the dispersion vehicle was changed to tetraethylene glycol dimethyl ether (with nonpolarity), an attempt was made to prepare a copper particulate dispersion. However, copper particulates were not dispersed.

COMPARATIVE EXAMPLE 5

In the same manner as in Comparative Example 3, except that the dispersion vehicle was changed to ethylene glycol monophenyl ether (with proticity, which is not within a technical scope of the present invention because of containing a phenyl group), an attempt was made to prepare a copper particulate dispersion. However, copper particulates were not dispersed.

COMPARATIVE EXAMPLE 6 in the same manner as in comparative example 3, except That the dispersion vehicle was changed to diethylene glycol Butyl methyl ether (with nonpolarity), a copper particulate Dispersion was prepared. This copper particulate dispersion Was stored at 5° c. For one month. As a result, a precipitate Was formed.

COMPARATIVE EXAMPLE 7 in the same manner as in comparative example 6, except That the dispersion vehicle was changed to triethylene glycol Butyl methyl ether (with nonpolarity), a copper particulate Dispersion was prepared. This copper particulate dispersion Was stored at 5° c. For one month. As a result, a precipitate Was formed.

COMPARATIVE EXAMPLE 8 in the same manner as in comparative example 7, except That the dispersion vehicle was changed to diethylene glycol Dibutyl ether (with nonpolarity), an attempt was made to Prepare a copper particulate dispersion. However, copper Particulates were not dispersed.

COMPARATIVE EXAMPLE 9

In the same manner as in Comparative Example 7, except that the dispersion vehicle was changed to diethylene glycol diethyl ether (with nonpolarity), a copper particulate dispersion was prepared. This copper particulate dispersion had a viscosity of 4 mPa·s. This copper particulate dispersion was stored at 5° C. for one month. As a result, a precipitate was formed.

COMPARATIVE EXAMPLE 10

In the same manner as in Comparative Example 9, except that the dispersion vehicle was changed to ethanol (with proticity, 4 or less carbon atoms, boiling point: 78° C.), a copper particulate dispersion was prepared. This copper particulate dispersion was stored at 5° C. for one month. As a result, elution (corrosion) of copper particulates into a dispersion vehicle occurred, and thus discoloration of the liquid occurred and a precipitation was formed.

COMPARATIVE EXAMPLE 11

In the same manner as in Comparative Example 10, except that the dispersion vehicle was changed to ethyl acetate (with nonpolarity), an attempt was made to prepare a copper particulate dispersion. However, copper particulates were not dispersed.

COMPARATIVE EXAMPLE 12

In the same manner as in Comparative Example 11, except that the dispersion vehicle was changed to hexane (with nonpolarity), an attempt was made to prepare a copper particulate dispersion. However, copper particulates were not dispersed.

COMPARATIVE EXAMPLE 13

In the same manner as in Comparative Example 12, except that the dispersion vehicle was changed to toluene (with nonpolarity), an attempt was made to prepare a copper particulate dispersion. However, copper particulates were not dispersed.

Comparative Example 14

In the same manner as in Comparative Example 13, except that the dispersion vehicle was changed to 2-propanol (with proticity, 4 or less carbon atoms, boiling point: 83° C.), a copper particulate dispersion was prepared. This copper particulate dispersion was stored at 5° C. for one month. As a result, elution (corrosion) of copper particulates into a dispersion vehicle occurred, and thus discoloration of the liquid occurred and a precipitation was formed.

COMPARATIVE EXAMPLE 15

In the same manner as in Comparative Example 14, except that the dispersion vehicle was changed to acetone (with aprotic polarity, dielectric constant: 21, boiling point: 56° C.), an attempt was made to prepare a copper particulate dispersion. However, copper particulates were not dispersed.

COMPARATIVE EXAMPLE 16

In the same manner as in Comparative Example 15, except that the dispersion vehicle was changed to water (with proticity, 4 or less carbon atoms, boiling point: 100° C.) and the dispersant was changed to an alkylammonium salt of a compound having a phosphoric acid group, which has a molecular weight of 1,000 or more and 2,000 or less (manufactured by BYK-Chemie under the trade name of "DISPERBYK (registered trademark)-180"), a copper particulate dispersion was prepared. This copper particulate dispersion was stored at 5° C. for one month. As a result, elution (corrosion) of copper particulates into a dispersion vehicle occurred, and thus discoloration of the liquid occurred and a precipitation was formed.

COMPARATIVE EXAMPLE 17

In the same manner as in Comparative Example 15, except that the dispersion vehicle was changed to 1-butanol (with proticity, 4 or less carbon atoms, boiling point: 117° C.), a copper particulate dispersion was prepared. This copper particulate dispersion was stored at 5° C. for one month. As a result, elution (corrosion) of copper particulates into a dispersion vehicle occurred, and thus discoloration of the liquid occurred and a precipitation was formed.

COMPARATIVE EXAMPLE 18

Using copper particulates having a center particle diameter of 400 nm, 3-methoxy-3-methyl butanol (with proticity) as a dispersion vehicle, and a compound having a phosphoric acid group, which has a molecular weight of about 1,500 (manufactured by BYK-Chemie under the trade name of "DISPERBYK (registered trademark)-111") as a dispersant, a copper particulate dispersion was prepared. The concentration of the dispersant was adjusted to 3.6% by weight and the concentration of copper particulates was adjusted to 40% by weight. The concentration of the dispersion vehicle is balance thereof. Copper particulates were not dispersed.

As mentioned above, a copper particulate dispersion vehicle in which the dispersion vehicle is a polar dispersion vehicle having a boiling point within a range from 150° C. to 250° C. had a viscosity, which was less than 20 mPa·s, suited to discharge in the form of droplets. A conductive film formed by photo sintering using this copper particulate dispersion had a resistivity of 9 μΩ·cm or less, and a desired low value was obtained. When the dispersion vehicle is a dispersion vehicle with nonpolarity or a dispersion vehicle having a boiling point of lower than 150° C., the obtained copper particulates were not dispersed, or a precipitate was formed after storage at 5° C. for one month.

The present invention is not limited to the constitutions of the above-mentioned embodiments, and various modifications can be made without departing from the scope of the present invention.

The invention claimed is:

1. A copper particulate dispersion comprising copper particulates, at least one kind of a dispersion vehicle containing the copper particulates, and at least one kind of dispersant which allows the copper particulates to disperse in the dispersion vehicle, wherein
the copper particulates have a center particle diameter of 1 nm or more and less than 100 nm, concentration of the copper particulates is 1% by weight or more and 80% by weight or less based on the copper particulate dispersion,
the dispersion vehicle is a polar dispersion vehicle having a boiling point within a range from 150° C. to 250° C.,
the polar dispersion vehicle contains at least one of a protic dispersion vehicle and an aprotic polar dispersion vehicle having a dielectric constant of 30 or more,
the protic dispersion vehicle is selected from the group consisting of diethylene glycol monobutyl ether, diethylene glycol monomethyl ether, 2-methylpentane-2,4-diol, ethylene glycol, propylene glycol, 1,5-pentanediol, diethylene glycol, triethylene glycol, glycerin and sorbitol,
the aprotic polar dispersion vehicle is selected from the group consisting of hexamethylphosphoramide, N-methyl pyrrolidone, N-ethyl pyrrolidone, nitrobenzene, N, N-diethylformamide, N, N-dimethylacetamide, furfural, γ-butyrolactone, ethylene sulfite, sulfolane, dimethyl sulfoxide, succinonitrile and ethylene carbonate,
the dispersant is a compound having at least one acidic functional group, which has a molecular weight of 200 or more and 100,000 or less, or a salt thereof, concentration of the dispersant is 0.5% by weight or more and 50% by weight or less based on the copper particulate dispersion, and
the acidic functional group of the dispersant is selected from the group consisting of a phosphoric acid group, a phosphoric acid group, a sulfonic acid group and a sulfuric acid group.

2. A conductive film forming method comprising the steps of:
discharging the copper particulate dispersion according to claim 1 on a surface of an object in the form of droplets to form a film made of the copper particulate dispersion on the surface of the object,
drying the film thus formed, and
forming a conductive film through photo sintering of irradiating the dried film with light.

3. A circuit board comprising a circuit including the conductive film formed by the conductive film forming method according to claim 2 on a substrate.

* * * * *